United States Patent
Nakano et al.

(10) Patent No.: US 8,042,067 B2
(45) Date of Patent: Oct. 18, 2011

(54) PATTERN FORMING METHOD AND SYSTEM, AND METHOD OF MANUFACTURING A SEMICONDUCTOR DEVICE

(75) Inventors: Ayako Nakano, Yokohama (JP); Toshiya Kotani, Machida (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 599 days.

(21) Appl. No.: 12/216,220

(22) Filed: Jul. 1, 2008

(65) Prior Publication Data

US 2008/0276216 A1    Nov. 6, 2008

Related U.S. Application Data

(62) Division of application No. 10/823,539, filed on Apr. 14, 2004, now Pat. No. 7,402,363.

(30) Foreign Application Priority Data

Apr. 15, 2003  (JP) ................................. 2003-110254

(51) Int. Cl.
*G06F 17/50*  (2006.01)
*G03F 1/00*  (2006.01)
(52) U.S. Cl. ................ 716/50; 716/51; 716/52; 716/53; 716/54; 430/5; 430/30
(58) Field of Classification Search .............. 716/50–56; 430/5, 30
See application file for complete search history.

(56) References Cited

U.S. PATENT DOCUMENTS

| 6,316,163 | B1 | 11/2001 | Magoshi et al. | |
|---|---|---|---|---|
| 6,399,260 | B1 | 6/2002 | Kikuchi | |
| 6,570,174 | B1 | 5/2003 | Tounai et al. | |
| 6,853,743 | B2 | 2/2005 | Kotani et al. | |
| 2002/0043615 | A1* | 4/2002 | Tounai et al. | .................. 250/221 |
| 2003/0223630 | A1* | 12/2003 | Adel et al. | .................... 382/145 |
| 2005/0034093 | A1 | 2/2005 | Yamauchi | |

FOREIGN PATENT DOCUMENTS

| JP | 09-319067 | 12/1997 |
|---|---|---|
| JP | 10-055059 | 2/1998 |
| JP | 2000-258892 | 9/2000 |
| JP | 2001-083689 | 3/2001 |
| JP | 2002-131882 | 5/2002 |

OTHER PUBLICATIONS

Notification of Reasons for Rejection from the Japanese Patent Office, mailed Oct. 2, 2007.

* cited by examiner

*Primary Examiner* — Paul Dinh
(74) *Attorney, Agent, or Firm* — Finnegan, Henderson, Farabow, Garrett & Dunner, L.L.P.

(57) ABSTRACT

A pattern forming method of forming a desired pattern on a semiconductor substrate is disclosed, which comprises extracting a first pattern of a layer, extracting a second pattern of one or more layers overlapped with the layer, the second pattern being arranged close to or overlapped with the first pattern, calculating a distance between the first and second patterns on a semiconductor substrate in consideration of a predetermined process variation, determining whether or not the distance between the first and second patterns satisfy an allowable margin given for the distance between the first and second patterns, and correcting, if the distance does not satisfy the allowable margin, at least one of the first and second patterns to satisfy the allowable margin.

12 Claims, 12 Drawing Sheets

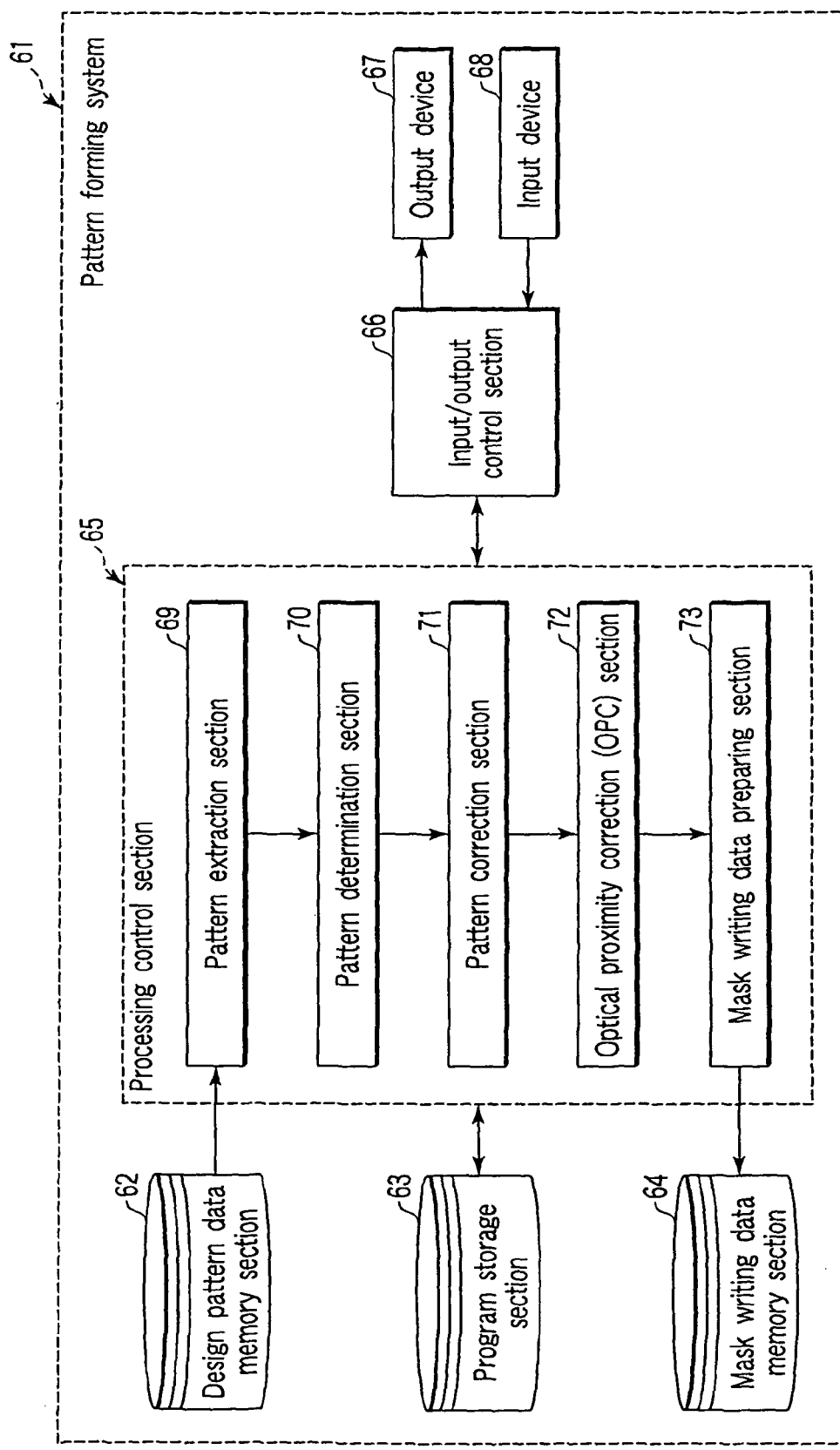
F I G. 14

PATTERN FORMING METHOD AND SYSTEM, AND METHOD OF MANUFACTURING A SEMICONDUCTOR DEVICE

CROSS-REFERENCE TO RELATED APPLICATIONS

This is a division of application Ser. No. 10/823,539, filed Apr. 14, 2004 now U.S. Pat. No. 7,402,363, which is incorporated herein by reference.

This application is based upon and claims the benefit of priority from prior Japanese Patent Application No. 2003-110254, filed Apr. 15, 2003, the entire contents of which are incorporated herein by reference.

BACKGROUND OF THE INVENTION

1. Field of the Invention

The present invention relates to a mask pattern. In particular, the present invention relates to a pattern forming method and system, which are suitable for forming patterns having a sufficient process margin, and to a method of manufacturing a semiconductor device using the pattern forming method.

2. Description of the Related Art

Recently, high integration and high-speed performance of semiconductor devices have advanced. For this reason, the requirements for pattern formation of semiconductor integrated circuits are very severe.

In semiconductor integrated circuits, the design rule representing the design and manufacture minimum line width becomes narrow with the improvement of nano-fabrication techniques. At present, semiconductor integrated circuits having a line width of less than 100 nm are manufactured.

If a range satisfying the foregoing design rule is given, designers can freely make a design of the circuit pattern.

Semiconductor integrated circuits are manufactured by etching various material films formed on a semiconductor substrate using resist patterns formed by a lithography technique as masks. For this reason, predetermined rule (pattern rule) is required in the pattern critical dimensions of each exposure mask and relative pattern critical dimensions between exposure masks.

For example, when the layout of the semiconductor integrated circuits is designed, the following matters are determined as the pattern arrangement rule. One is the minimum processing dimension, and another is dimension change (difference in processing conversion) before and after processing. Another is alignment accuracy when overlapping different exposure masks.

However, the circuit pattern is micronized, thereby influencing the semiconductor device characteristic resulting from the following reason. The pattern formed on the exposure mask is transferred onto the semiconductor substrate in the lithography process in the manufacture of semiconductor devices. In this case, deviation is given due to optical proximity effect (OPE) between design dimension and actual dimension when transferred onto the semiconductor substrate.

For example, even if the pattern satisfies the design rule, the acute portion of the pattern is not fully transferred; as a result, it becomes round. In addition, line dimension changes due to isolated and nested distribution of the line pattern.

In order to correct the deviation, the following method, that is, the optical proximity correction (OPC) technique, has been known. According to the OPC technique, the pattern critical dimensions on the exposure mask are corrected using optical simulation. For example, the pattern width is partially thickened, or a dummy pattern is provided.

However, the OPC technique corrects the pattern critical dimensions on the exposure mask so that the pattern formed on the semiconductor substrate is formed as design pattern critical dimensions. Thus, the OPC technique is not suitable for increasing the process margin in the lithography process.

Consequently, the OPC technique is not effective with respect to a patterns having process margin, which does not satisfy the reference value. The process margin shows an allowable range where the pattern is formed based on the dimensions having no problem on the semiconductor device characteristic even if the following condition is given. The condition is that exposure parameters, for example, exposure and focal length vary from their proper value when the pattern is transferred onto the semiconductor substrate.

The pattern forming method to solve the foregoing problem is disclosed in JPN. PAT. APPLN. KOKAI Publication No. 2002-131882 (pages 5 to 8, FIG. 2), for example.

The pattern forming method disclosed in the Publication No. 2002-131882 will be explained with reference to FIG. 17 to FIG. 20. FIG. 17 is a flowchart to explain the pattern forming method. FIG. 18 is a view showing the layout before circuit patterns are corrected. FIG. 19 is a layout view showing circuit the patterns of maximum and minimum line dimension when conditions such as an exposure amount and a focal length are varied to the circuit patterns shown in FIG. 18. FIG. 20 a view showing the layout after the circuit patterns shown in FIG. 18 are corrected.

As shown in FIG. 18 to FIG. 20, the pattern is composed of lines and spaces. More specifically, patterns 102 to 104 are arranged in parallel on an exposure mask 101. The pattern 102 has a line dimension L1. The pattern 103 has a line dimension L2, and is formed via a space dimension S1. The pattern 104 has a line dimension L3, and is formed via a space dimension S2.

First, the design pattern data is read from a data recorder, and a process margin is obtained from the relation between lines and spaces. Thereafter, the pattern having process margin, which does not satisfy the reference value, is extracted from the design pattern.

More specifically, lithography simulation is carried out while changing the exposure and focal length by predetermined ratio. By doing so, variables $\delta1$ to $\delta3$ of line dimensions L1 to L3 of patterns 102 to 104 are determined.

In the foregoing Publication No. 2002-131882, it is determined that $\delta2$ and $\delta3$ are larger than $\delta1$, and each process margin of patterns 103 and 104 does not satisfy the reference value (step S101).

The pattern is corrected so that the process margin satisfies the reference value (step. S102). More specifically, both edges 103a and 103b of the pattern 103 are shifted to their sides so that the line dimension L2 is widened to L2'. An edge 104a of the pattern 104 is shifted to the side so that the line dimension L3 is widened to L3'.

The pattern is corrected, and thereafter, a check is made whether or not the pattern pitch is kept constant (step S103).

If the pattern pitch is not kept constant, the procedure returns to step S102, and then, the pattern is again corrected in the following manner. Space dimensions S1 and S2 are narrowed down to S1' and S2' in accordance with the line dimension correction so that the pattern pitch before and after correction is kept constant.

Then, it is determined whether or not the wiring capacitance of the corrected pattern is in an allowable range (step S104). This is because the following matter is taken into consideration. In correcting the process margin of the pattern, the line dimension is widened, and thereby, there is a possibility described below. Parasitic capacitance (wiring capacitance) generated between top and bottom layers exceeds an allowable value in multi-layer interconnection.

If the wiring capacitance is not in the allowable range, the procedure returns to step S102, and then, the pattern is again corrected.

If the wiring capacitance is in the allowable range, it is determined whether or not the corrected pattern satisfies the design rule. More specifically, it is determined whether or not the line and space dimensions of the corrected pattern are more than the minimum line and space dimensions predetermined in the design rule (step S105).

If the corrected pattern does not satisfy the design rule, the procedure returns to step S102, and then, the pattern is again corrected to satisfy the design rule.

On the other hand, if the corrected pattern satisfies the design rule, the optical proximity correction (OPC) is carried out with respect to the necessary portions of the corrected pattern (step S106).

Finally, an exposure mask is prepared based on the corrected design pattern data (step S107).

The Publication No. 2002-131882 discloses the method of another embodiment taking the relation of one contact hole pattern with the space between adjacent contact hole patterns. According to the method of another embodiment, a pattern having a process margin, which does not satisfy the reference value is extracted. Thereafter, the extracted pattern is corrected to satisfy the process margin.

As described above, the pattern forming method disclosed in the Publication No. 2002-131882 improves the process margin of the following patterns. The patterns are patterns (line patterns) to be formed on the same exposure mask or patterns in the same exposure mask such as a contact hole pattern.

However, higher accuracy is required in pattern transfer to the semiconductor substrate, and in addition, further technical development is required to manufacture high-integrated semiconductor devices.

The foregoing pattern forming methods have a problem that it is not suitable for improving the process margin between patterns to be formed using a plurality of exposure masks.

BRIEF SUMMARY OF THE INVENTION

According to an aspect of the present invention, there is provided a pattern forming method of forming a desired pattern on a semiconductor substrate comprising:

extracting a first pattern of a layer;

extracting a second pattern of one or more layers overlapped with the layer, the second pattern being arranged close to or overlapped with the first pattern;

calculating a distance between the first and second patterns on a semiconductor substrate in consideration of a predetermined process variation;

determining whether or not the distance between the first and second patterns satisfy an allowable margin given for the distance between the first and second patterns; and correcting, if the distance does not satisfy the allowable margin, at least one of the first and second patterns to satisfy the allowable margin.

According to another aspect of the present invention, there is provided a mask pattern forming method of forming a desired pattern on a semiconductor substrate comprising:

extracting a first design pattern of a layer;

extracting a second design pattern of one or more layers overlapped with the layer, the second design pattern being arranged close to or overlapped with the first design pattern;

correcting the first design pattern in accordance with a correction rule of a design pattern defined by at least one of widths of the first and second design patterns on one hand and a distance between the first and second design patterns on the other hand; and forming a mask pattern by further correcting the first design pattern having corrected in accordance with the correction rule, by process proximity effect correction.

According to a further aspect of the present invention, there is provided a pattern forming system of forming a desired pattern on a semiconductor substrate comprising:

an extracting section configured to extract a first pattern of a layer;

an extracting section configured to extract a second pattern of one or more layers overlapped with the layer, the second pattern being arranged close to or overlapped with the first pattern;

a calculating section configured to calculate a distance between the first and second patterns on a semiconductor substrate in consideration of a predetermined process variation;

a determining section configured to determine whether or not the distance between the first and second patterns satisfy an allowable margin given for the distance between the first and second patterns; and a correcting section configured to correct, if the distance does not satisfy the allowable margin, at least one of the first and second patterns to satisfy the allowable margin.

According to a further aspect of the present invention, there is provided a mask pattern forming system of forming a desired pattern on a semiconductor substrate comprising:

an extracting section configured to extract a first design pattern of a layer;

an extracting section configured to extract a second design pattern of one or more layers overlapped with the layer, the second design pattern being arranged close to or overlapped with the first design pattern;

a correcting section configured to correct the first design pattern in accordance with a correction rule of a design pattern defined by at least one of widths of the first and second design patterns on one hand and a distance between the first and second design patterns on the other hand; and a forming section configured to form a mask pattern by further correcting the first design pattern having corrected in accordance with the correction rule, by process proximity effect correction.

According to a further aspect of the present invention, there is provided a method of manufacturing a semiconductor device comprising:

extracting a first pattern of a layer;

extracting a second pattern of one or more layers overlapped with the layer, the second pattern being arranged close to or overlapped with the first pattern;

calculating a distance between the first and second patterns on a semiconductor substrate in consideration of a predetermined process variation;

determining whether or not the distance between the first and second patterns satisfy an allowable margin given for the distance between the first and second patterns;

correcting, if the distance does not satisfy the allowable margin, at least one of the first and second patterns to satisfy the allowable margin;

forming an exposure mask according to the at least one corrected pattern; and forming a semiconductor device on the semiconductor substrate via a lithography process by using the exposure mask.

BRIEF DESCRIPTION OF THE SEVERAL VIEWS OF THE DRAWING

FIG. 14 is a block diagram showing the configuration of a pattern forming system according to a third embodiment of the present invention;

DETAILED DESCRIPTION OF THE INVENTION

Embodiments of the present invention will be described below with reference to the accompanying drawings.

First Embodiment

A pattern forming method according to a first embodiment of the present invention will be described below.

Figure 1:
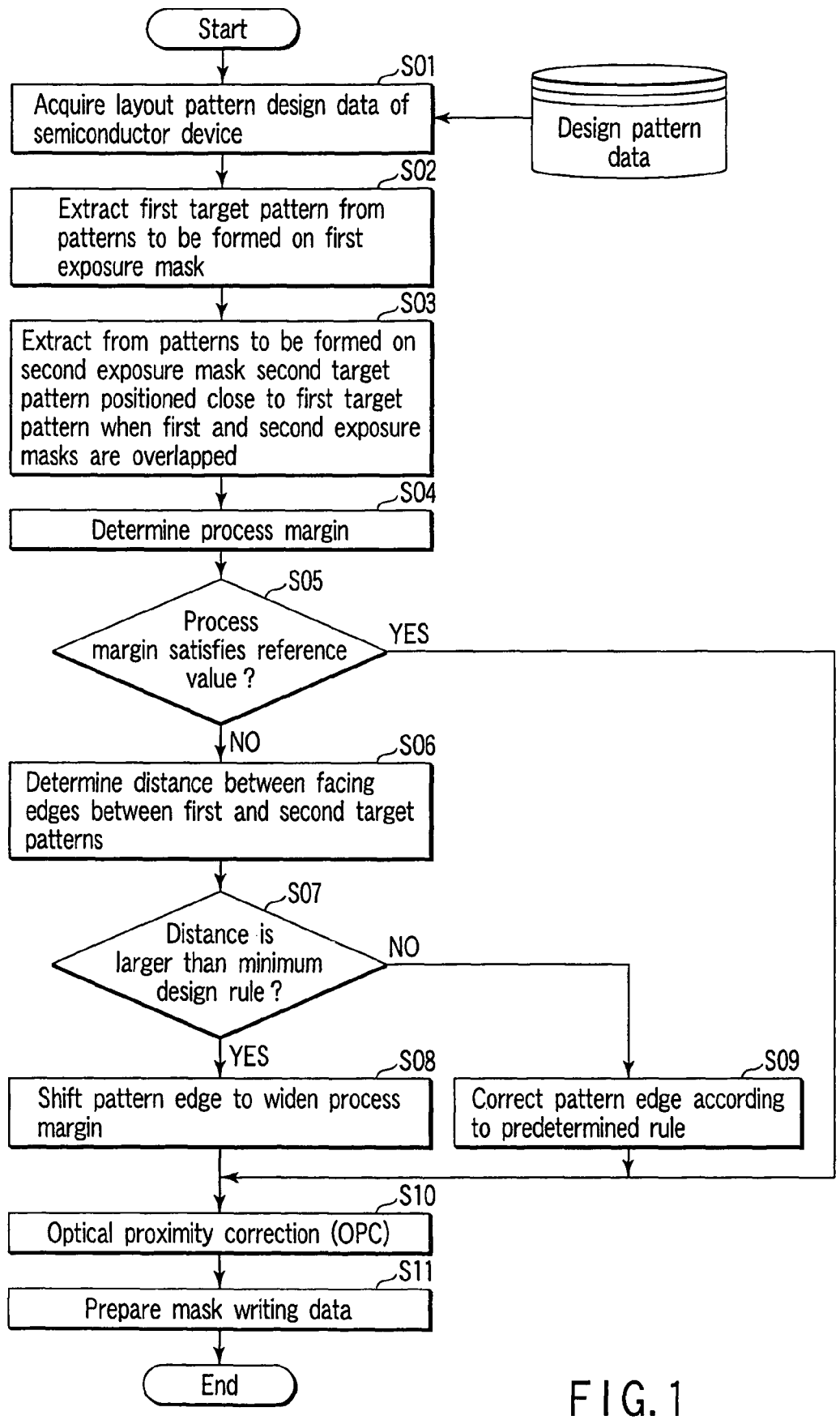
FIG. 1 is a flowchart of a pattern forming method according to a first embodiment of the present invention.

FIG. 1 is a flowchart to explain the pattern forming method according to the first embodiment of the present invention. The flowchart of FIG. 1 shows the processes until exposure mask writing data is prepared from design pattern data of a semiconductor device.

As shown in FIG. 1, layout pattern design data (design pattern data) of the semiconductor device formed on a semiconductor substrate according to a predetermined design rule is acquired from a design pattern data recorder (step S01), and circuit patterns are selected from the acquired design data. The selected circuit patterns are composed of patterns to be formed in a plurality of exposure masks.

First, a first target pattern having a process margin to be checked is extracted from patterns to be formed on a first exposure mask (step S02).

Then, a second target pattern to be formed on a second exposure mask is extracted (step S03). The second target pattern is positioned close to the first target pattern when the second exposure mask is overlapped with the first exposure mask.

A Process margin for variation of the first and second target patterns due to the change of conditions of the exposure parameters caused when the first and second target patterns are transferred onto a semiconductor wafer, is determined (step S04).

The process margin is found out of the difference between maximum and minimum pattern critical dimensions when exposure and focal length is changed within a predetermined range according to lithography simulation.

In step S05, it is determined whether or not the process margin satisfies a given reference value. If the process margin does not satisfy the reference value, pattern correction is required; for this reason, the process proceeds to step S06. On the other hand, if the process margin satisfies the reference value, no pattern correction is required; therefore, the process jumps to step S10.

If the process margin does not satisfy the reference value, a distance between the first and second target patterns is determined (step S06). Thereafter, it is determined whether or not the distance is larger than the minimum design rule.

In this case, the minimum design rule means the minimum one of the design rules in a layer of the semiconductor device, in which the target pattern exists.

If the distance between the first and second target patterns is larger than the minimum design rule, the pattern edge is shifted so that the process margin is widened to form a corrected new pattern (step S08). On the other hand, if the foregoing distance is smaller than the minimum design rule, a rule for correcting pattern is prepared according to lithography simulation or experiment. In this case, the rule is prepared within a range of having no influence on the device characteristic. Thereafter, the pattern edge is corrected according to the predetermined rule (step S09).

In either case, optical proximity correction (OPC) of the pattern is carried out (step S10), and thereafter, exposure mask writing data is prepared (step S11).

The foregoing pattern forming process is carried out with respect to each of all circuit patterns existing in design pattern data. The design pattern data is used as exposure mask pattern data finally written to exposure mask.

The following is a detailed explanation about the case of correcting the circuit pattern according to the pattern forming method to improve the process margin.

Figure 2:
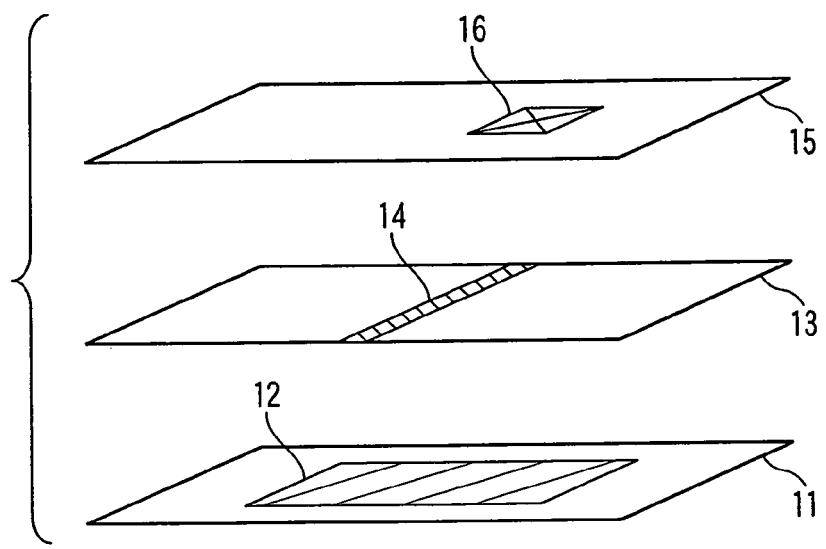
FIG. 2 is a view showing the appearance of exposure masks, for explaining the pattern forming method according to the first embodiment of the present invention, and shows patterns formed on the exposure masks.
Figure 3:
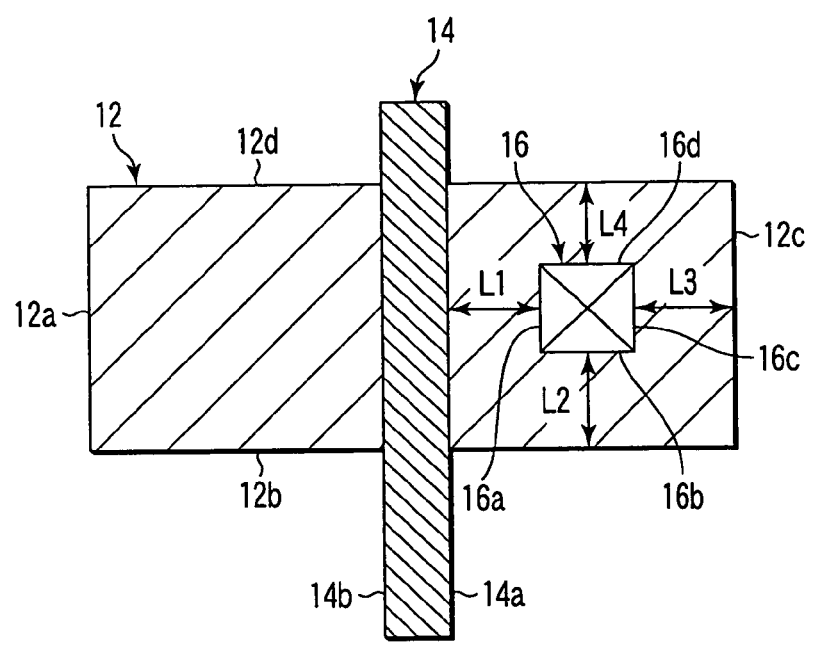
FIG. 3 is a view showing an example of a circuit pattern obtained by overlapping the exposure masks shown in FIG. 2.

FIG. 2 is a view showing the appearance of three exposure masks used in the lithography process of semiconductor device, and, in particular, shows each circuit pattern formed on three exposure masks. FIG. 3 shows a pattern obtained by overlapping three exposure masks shown in FIG. 2. The pattern is composed of a diffusion layer by ion implantation, a gate wiring and a contact hole, which are arranged close to each other.

As illustrated in FIG. 2, an ion implantation layer pattern 12 for forming a diffusion layer by ion implantation is formed on a first exposure mask 11. A gate pattern 14 for forming a gate wiring is formed on a second exposure mask 13. A contact hole pattern 16 for forming a contact hole is formed on a third exposure mask 15.

More specifically, using the first exposure mask 11, the ion implantation layer pattern 12 is formed at a predetermined region of a resist film formed on a semiconductor substrate, by lithography technique. Thereafter, ion implantation and an activation process are carried out. Subsequently, the semiconductor substrate is formed with insulating film and gate wiring film, and thereafter, the gate pattern 14 is formed in the gate wiring film using the second exposure mask 13. Further, the contact hole pattern 16 is opened at the insulating film using the third exposure mask 15.

As seen from FIG. 3, the circuit pattern has the following edges. One is edges 16a to 16d of the contact hole pattern 16 of the third exposure mask 15. Another is closely facing edges 14a, 14b of the gate pattern 14 of the second exposure mask 13. Another is edges 12a to 12d of the ion implantation pattern 12 of the first exposure mask 11. Here, in the circuit pattern, the distance between the edge 16a of the contact hole pattern and the edge 14a of the gate pattern 14 is set as L1. The distance between the edges 16b and 12b is set as L2. The distance between the edges 16c and 12c is set as L3. The distance between the edges 16d and 12d is set as L4.

If it is determined that the contact hole pattern 16 of the third exposure mask 15 has process margin less than the reference value in the lithography process according to the flowchart shown in FIG. 1, the following procedure is taken. Design pattern distances (L1, L2, L3, L4) between exposure masks are found, and based on the result, correction for forming a new circuit pattern is carried out to widen the process margin.

Figure 4:
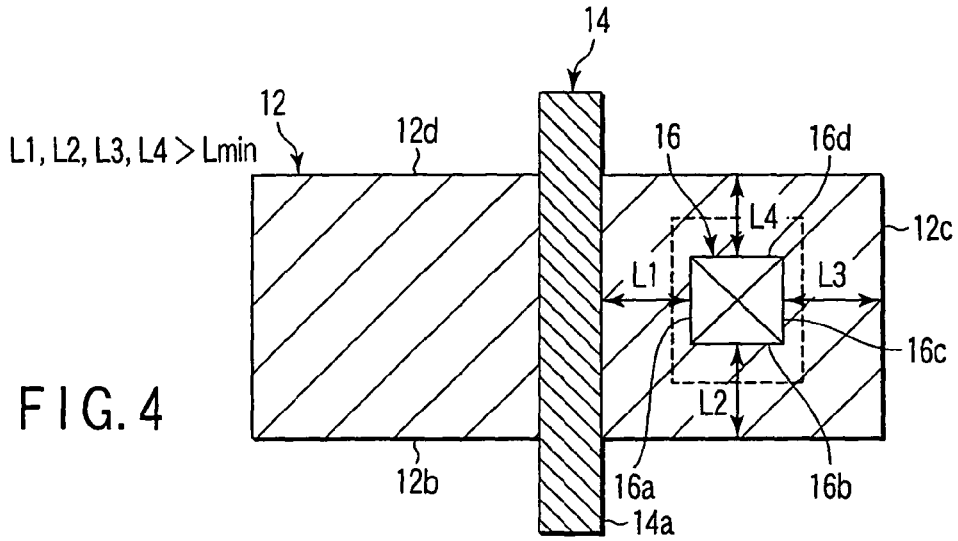
FIG. 4 is a view showing an example of a circuit pattern obtained by overlapping the exposure masks of FIG. 2.
Figure 5:
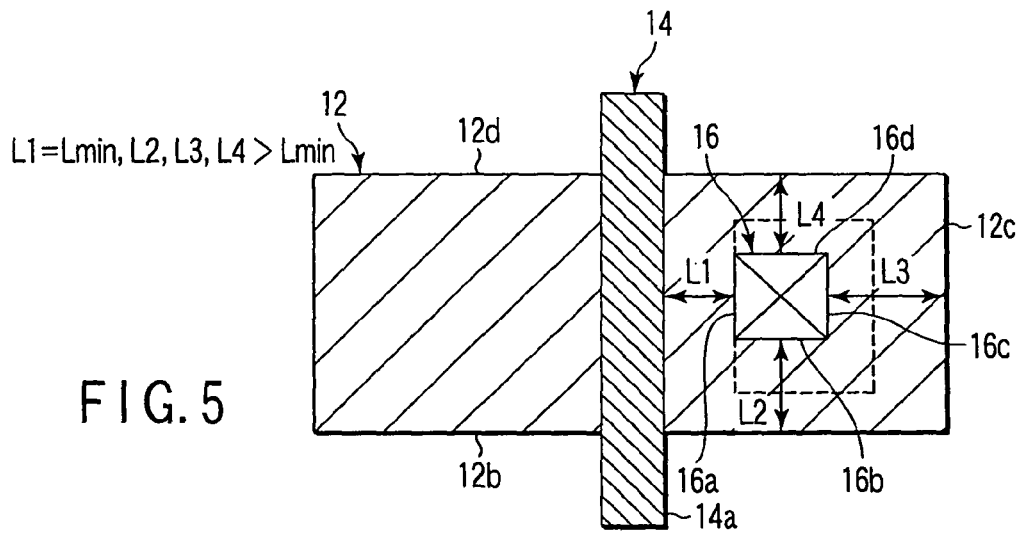
FIG. 5 is a view showing an example of a circuit pattern obtained by overlapping the exposure masks of FIG. 2.
Figure 6:
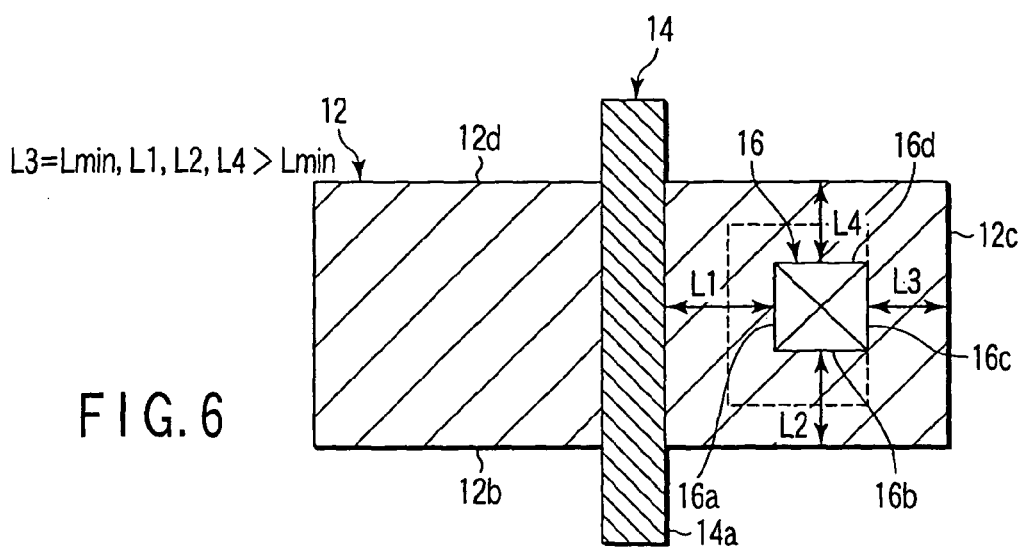
FIG. 6 is a view showing an example of a circuit pattern obtained by overlapping the exposure masks of FIG. 2.

FIG. 4 to FIG. 6 is views to explain modification rule of the circuit pattern. For example, if all of L1 to L4 are larger than the minimum design rule (Lmin) as depicted in FIG. 4, edges 16a to 16d of the contact hole pattern 16 are shifted to edges 12a to 12d, respectively. By doing so, the dimension of the contact hole pattern 16 is made large so that the process margin is taken larger than the reference value.

If the distance L1 between the edge 16a of the contact hole pattern and the edge 14a of the gate pattern 14 is equal to Lmin as shown in FIG. 5, the following procedure is taken. The edge 16a is fixed while other edges 16b to 16d are shifted to edges 12b to 12d, respectively. By doing so, the dimension of the contact hole pattern 16 is made large so that the process margin is taken larger than the reference.

If the distance L3 between the edges 16c of the contact hole pattern 16 and the edge 12c of the ion implantation pattern 12 is equal to Lmin as shown in FIG. 6, the following procedure is taken. The edge 16c is fixed while other edges 16a, 16b and 16d are shifted to edges 12a, 12b and 12d, respectively. In this way, the dimension of the contact hole pattern 16 is made large so that the process margin is taken larger than the reference.

If the distance L2 between the edges 16b of the contact hole pattern 16 and the edge 12b of the ion implantation pattern 12 and the distance L4 between the edge 16d thereof and the edge 12d thereof or several distances L are equal to Lmin, the same procedure as above is taken. Edges on which other distances L is larger than Lmin are shifted. By doing so, the dimension of the contact hole pattern 16 is made large so that the process margin is taken larger than the reference.

Here, each edge shift is determined by simulation or experiment in accordance with the situation, using a value when each of distances L1 to L4 is equal to the minimum design rule as the upper limit.

According to the pattern forming method of the first embodiment of the present invention, patterns positioned close to each other or overlapped with each other when a plurality of exposure masks having the patterns are used to form a pattern, are extracted. Pattern correction is carried out in accordance with the distance between the patterns of the masks, and thereby, the process margin between the patterns of the masks is improved. Consequently, the transfer accuracy of the pattern of the masks to a semiconductor substrate is improved, so that semiconductor devices can be readily manufactured.

In the first embodiment, the first to third exposure mask 11, 13 and 15 are formed with ion implantation layer pattern 12, gate pattern 14 and contact hole pattern 16, respectively. The patterns may be via layer, metal layer, isolation layer, gate layer, etc. Modification example will be described below.

Modification Example of First Embodiment

Figure 7:
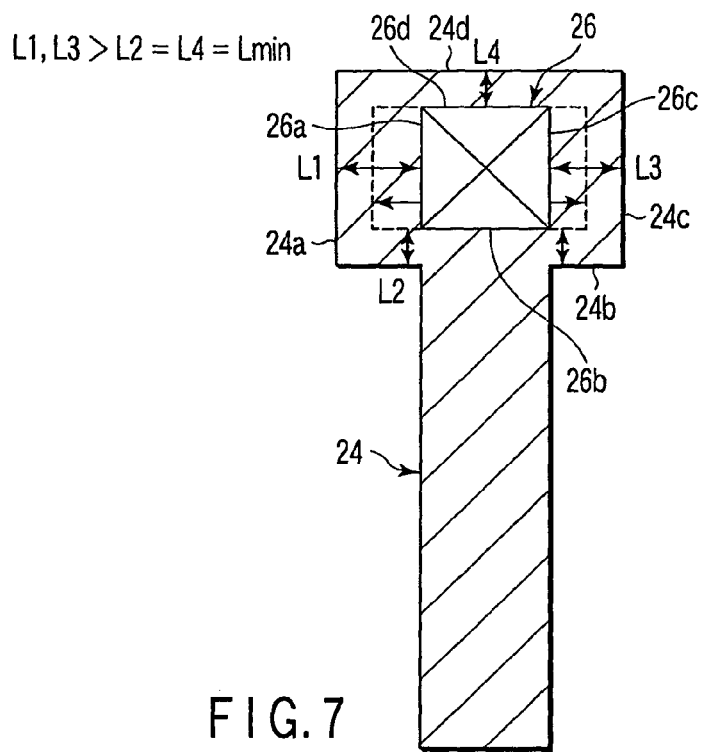
FIG. 7 is a view showing a circuit pattern, for explaining a first modification example of the first embodiment of the present invention.

FIG. 7 shows a circuit pattern according to a first modification example of the first embodiment of the present invention. The modification example differs from the first embodiment in that a metal wiring line is formed with via hole. More specifically, the second exposure mask 13 is formed with a metal pattern 24, and the third exposure mask 15 is formed with a via hole 26. According to the modification example, in order to make correspondence to the first embodiment, exposure mask formed with the circuit pattern calls the second exposure mask while exposure mask formed with the via hole pattern calls the third exposure. In this case, the given wring pattern comprises two exposure masks, and not three exposure masks.

As shown in FIG. 7, the metal pattern 24 is formed at predetermined region of the semiconductor substrate formed with a metal wiring film by lithography technique using the second exposure mask 13. The via hole pattern 26 is opened in the metal wiring using the third exposure mask 15.

The circuit pattern has edges 24a to 24d of the metal pattern 24 of the second exposure mask 13 and edges 26a to 26d of the via hole pattern 26 of the third exposure mask 15. Here, in the circuit pattern, the distance between edges 24a and 26a is set as L1, and the distance between edges 24b and 26b is set as L2. The distance between edges 24c and 26c is set as L3, and the distance between edges 24d and 26d is set as L4.

If it is determined that the via hole pattern 26 of the third exposure mask 15 has process margin less than the reference value in the lithography process according to the flowchart shown in FIG. 1, the following procedure is taken. Design pattern distances (L1, L2, L3, L4) between the second and third exposure masks 13 and 15 are found, and based on the result, correction for forming a new circuit pattern is carried out to widen the process margin.

For example, if the distance L2 between the edge 24b of the metal pattern 24 and the edge 26b of the via hole pattern 26 and the distance L4 between the edge 24d thereof and the edge 26d thereof are both equal to Lmin, the following procedure is taken. The edges 26b and 26d are fixed while other edges 26a and 26c are shifted to edges 24a and 24c, respectively. By doing so, the dimension of the via hole pattern 26 is made large so that the process margin is taken larger than the reference value.

According to the present first modification example, a metal pattern and a via hole pattern overlapped with each other when a plurality of exposure masks are used to provide a pattern, are extracted. Pattern correction is carried out in accordance with the distance between the patterns of the masks, and thereby, the process margin between the patterns of the masks is improved. Consequently, the transfer accuracy of the patterns of the masks to the semiconductor substrate is improved, so that semiconductor devices can be readily manufactured.

In the modification example, edges 26a and 26c are corrected in the case where distanced L2 and L4 are equal to Lmin. Correction target edge is not limited to the foregoing case. Edges to be shifted may be various1y selected within a range satisfying the condition that each of distances L1 to L4 between edges is larger than the minimum.

Modification Example of Second Embodiment

Figure 8:
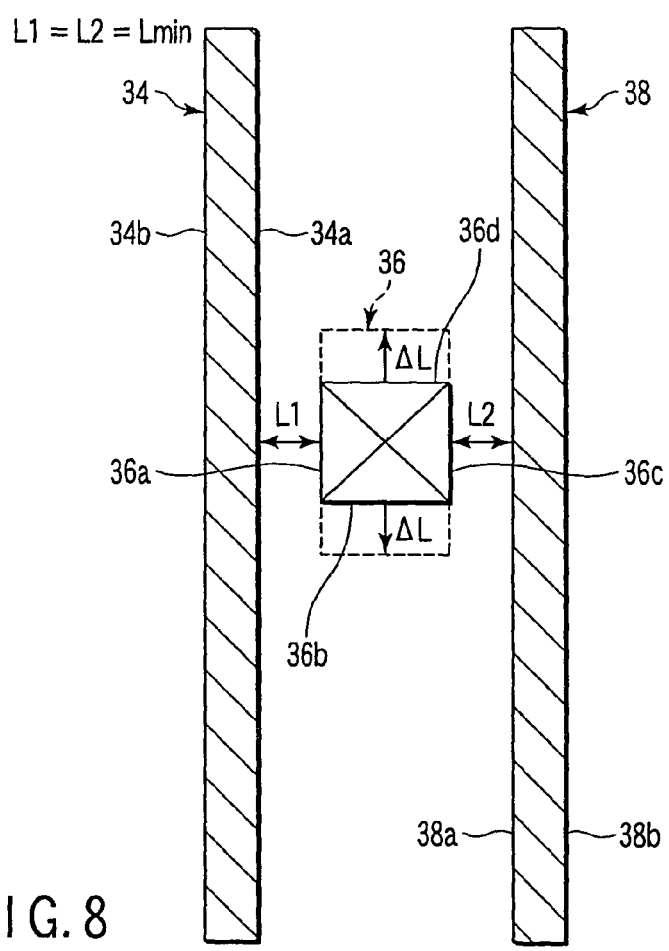
FIG. 8 is a view showing a circuit pattern, for explaining a second modification example of the first embodiment of the present invention.

FIG. 8 shows a circuit pattern according to a second modification example of the first embodiment of the present invention. The present modification example differs from the first embodiment in that a contact hole is formed to be sandwiched by two gate wiring lines. More specifically, the second exposure mask 13 is formed with two gate patterns 34 and 38, and the third exposure mask 15 is formed with a contact hole pattern 36. According to the modification example, in order to make correspondence to the first embodiment, exposure mask formed with the gate patterns calls the second exposure mask while exposure mask formed with the contact hole pattern calls the third exposure. In this case, the given wring pattern comprises two exposure masks, and not three.

As shown in FIG. 8, the gate patterns 34 and 38 are formed at predetermined region of the semiconductor substrate formed with a gate wiring film by lithography technique using the second exposure mask 13. The contact hole pattern 36 is opened to be sandwiched by the two gate wiring lines, using the third exposure mask 15.

The circuit pattern has edges 34a and 38a of the gate patterns 34 and 38 of the second exposure mask 13 and edges 36a to 36d of the contact hole pattern 36 of the third exposure mask 15. Here, in the circuit pattern, the distance between edges 34a and 36a is set as L1, and the distance between edges 38a and 36c is set as L2.

If it is determined that the contact hole pattern 36 of the third exposure mask 15 has process margin less than the reference value in the lithography process according to the flowchart shown in FIG. 1, the following procedure is taken. Design pattern distances (L1, L2) between the second and third exposure masks 13 and 15 are found, and based on the result, correction for forming a new circuit pattern is carried out to widen the process margin.

For example, if the distance L1 between the edge 34a of the gate pattern 34 and the edge 36a of the contact hole pattern 36 and the distance L2 between the edge 38a of the gate pattern 38 and the edge 36c of the contact hole pattern 36 are both equal to Lmin, the following procedure is taken. The edges 36a and 36c are fixed while other edges 36b and 36d are shifted in a direction parallel to edges 34a and 38a, respectively. By doing so, the dimension of the contact hole pattern 36 is made large so that the process margin is taken larger than the reference value.

According to the present second modification example, two gate patterns and a contact hole pattern close to each other when a plurality of exposure masks are used to provide a pattern, are extracted. Pattern correction is carried out in accordance with the distance between the patterns of the masks, and thereby, the process margin between the patterns of the masks is improved. Consequently, the transfer accuracy of the patterns of the masks to the semiconductor substrate is improved, so that semiconductor devices can be readily manufactured.

Modification Example of Third Embodiment

Figure 9:
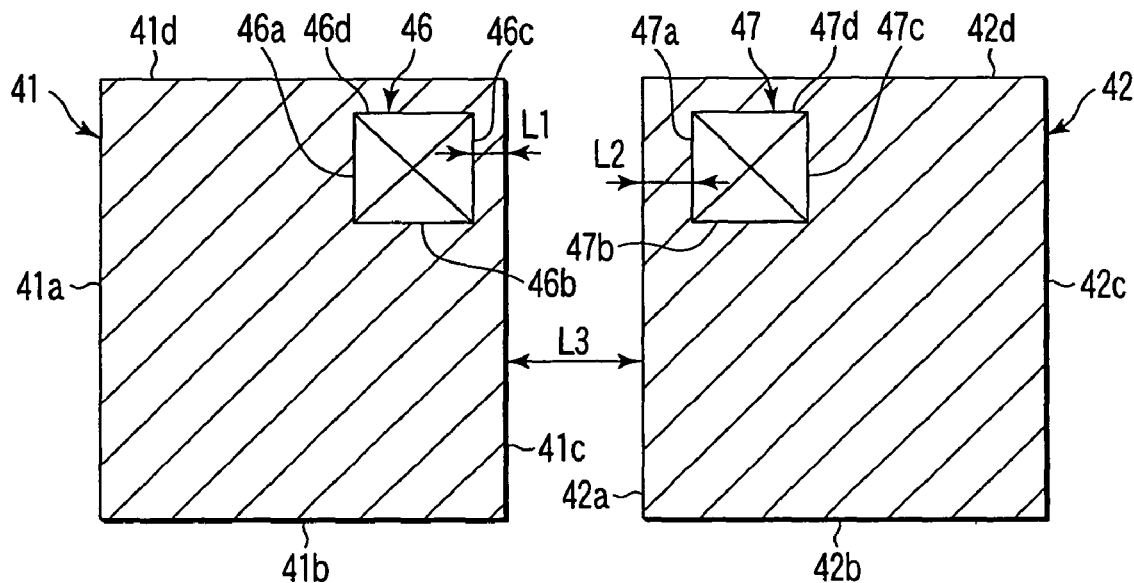
FIG. 9 is a view showing a circuit pattern, for explaining a third modification example of the first embodiment of the present invention, in which the layout is before being corrected.
Figure 10:
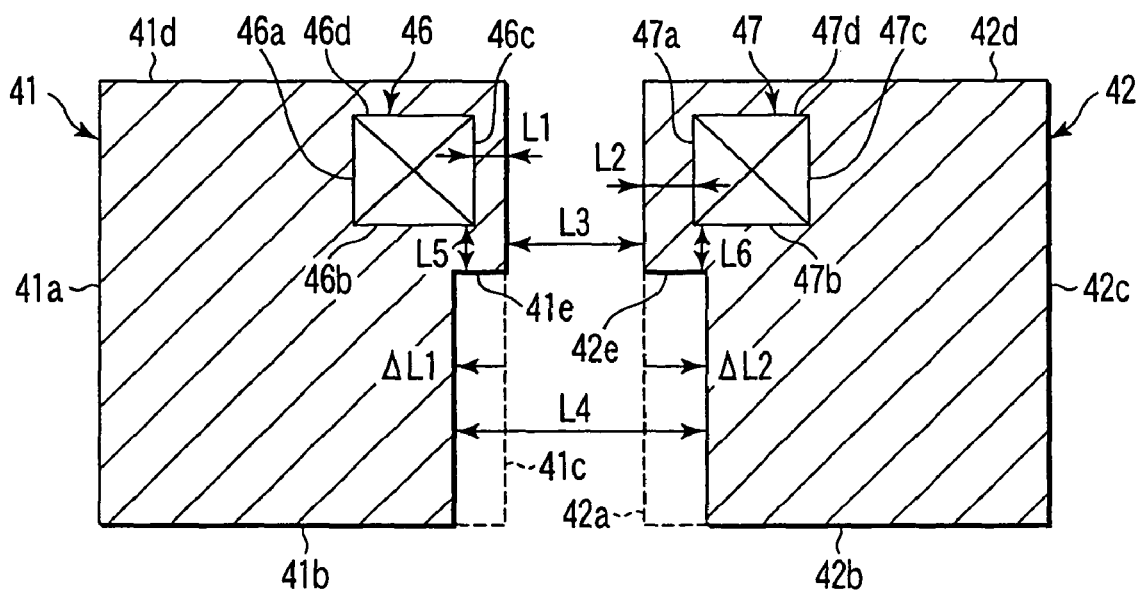
FIG. 10 is a view showing the circuit pattern of FIG. 9, for explaining the third modification example of the first embodiment of the present invention, in which the layout is after being corrected.

FIG. 9 shows a circuit pattern according to a third modification example of the first embodiment of the present invention, in which the layout is before being corrected, and FIG. 10 shows the circuit pattern according to the third modification example of the first embodiment of the present invention, in which the layout is after being corrected. The modification example differs from the first embodiment in that two closely arranged ion implantation diffusion layer patterns are formed with contact hole patterns, respectively.

More specifically, the first exposure mask 11 is formed with two ion implantation diffusion layer patterns 41 and 42, and the third exposure mask 15 is formed with two contact hole patterns 46 and 47. According to the modification example, in order to make correspondence to the first embodiment, exposure mask formed with the ion implantation diffusion layer patterns calls the first exposure mask while exposure mask formed with the contact hole patterns calls the third exposure. In this case, the given wring pattern comprises two exposure masks, and not three.

As shown in FIG. 9, the two ion implantation diffusion layer patterns 41 and 42 are formed at predetermined region of the semiconductor substrate formed with a resist film by lithography technique using the first exposure mask 11, followed by ion implantation and ion activation. Thereafter, an insulating film is formed on the semiconductor substrate, and then two contact hole patterns 46 and 47 are opened in the insulating film by lithography technique, using the third exposure mask 15.

The circuit pattern has edges 41a to 41d of the ion implantation diffusion layer patterns 41, edges 42a to 42d of the ion implantation diffusion layer patterns 42, edges 46a to 46d of the contact hole patterns 46, and edges 47a to 47d of the contact hole patterns 47. Here, in the circuit pattern, the distance between edges 41c and 46c is set as L1, the distance between edges 42a and 47a is set as L2, and the distance between edges 41c and 42a is set as L3.

If it is determined that the two ion implantation diffusion layer patterns 41 and 42 of the first exposure mask 11 has process margin less than the reference value in the lithography process according to the flowchart shown in FIG. 1, the following procedure is taken. Design pattern distances (L1, L2, L3) between the first and third exposure masks 11 and 15 are found, and based on the result, correction for forming a new circuit pattern is carried out to widen the process margin.

For example, if the distance L1 between the edge 41c of the ion implantation diffusion layer pattern 41 and the edge 46c of the contact hole pattern 46 and the distance L2 between the edge 42a of the ion implantation diffusion layer pattern 42 and the edge 47a of the contact hole pattern 47 are both equal to Lmin, the following procedure is taken. A part of the edge 41c and a part of the 42a are shifted toward each other while the distance between the edges 41c and 42a is widen from L3 to L4. By doing so, the process margin is taken larger than the reference value.

Here, the shift amount of the edges 41c and 42a is defined by lithography simulation or experiment. The distance L5 between the edges 46b and 41e and the distance L6 between the edges 47b and 42e are set to be larger than Lmin to keep the minimum design rule of the patterns 41, 42, 46 and 47.

According to the present third modification example, two ion implantation diffusion layer patterns and contact hole patterns overlapped with each other when a plurality of exposure masks are used to provide a pattern, are extracted. Correction of the implantation diffusion layer patterns is carried out in accordance with the distance between the patterns of the masks, and thereby, the process margin between the patterns of the masks is improved. Consequently, the transfer accuracy of the patterns of the masks to the semiconductor substrate is improved, so that semiconductor devices can be readily manufactured.

Second Embodiment

Figure 11:
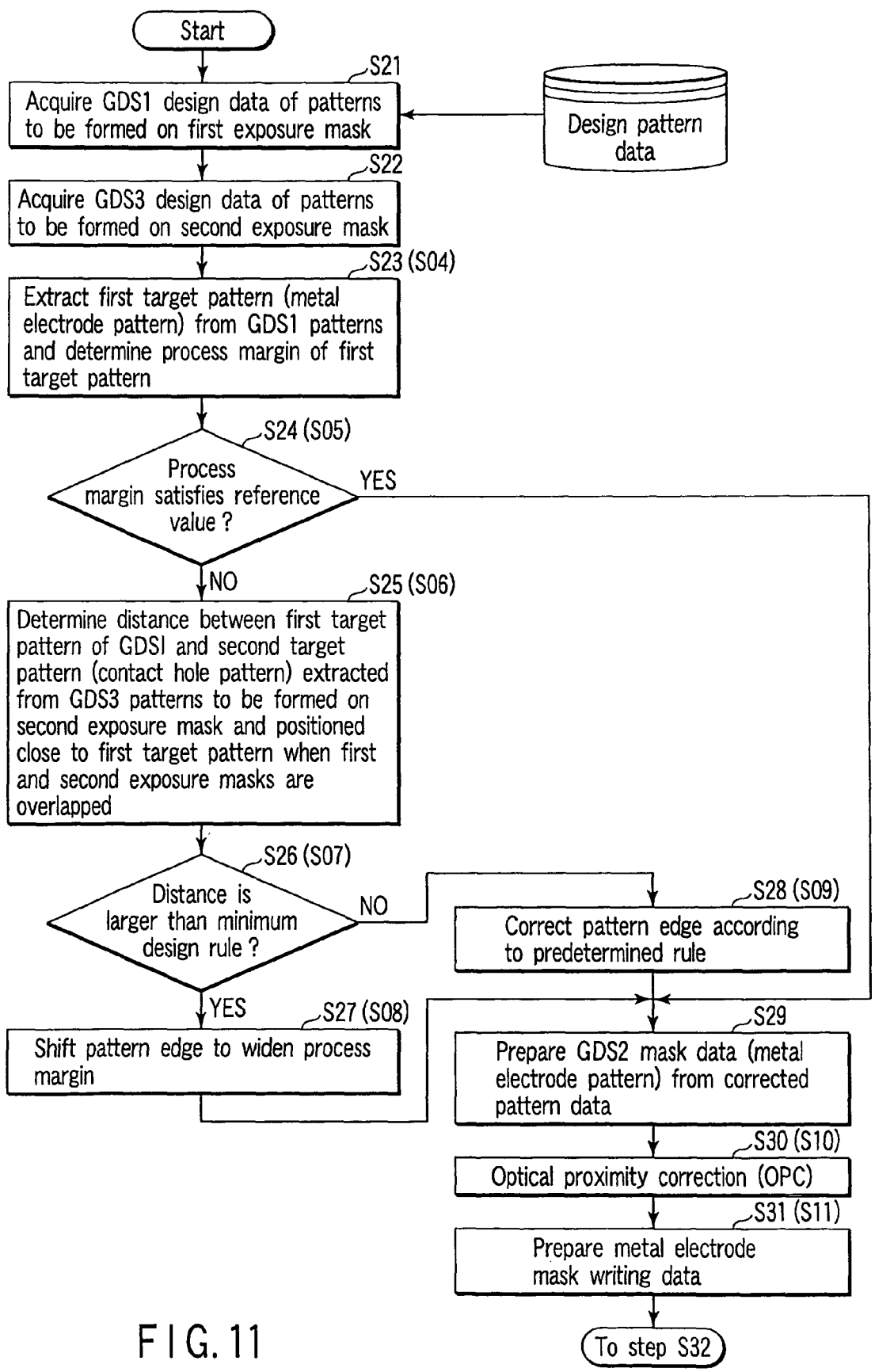
FIG. 11 is a flowchart to explain a pattern forming method according to a second embodiment of the present invention.
Figure 12:
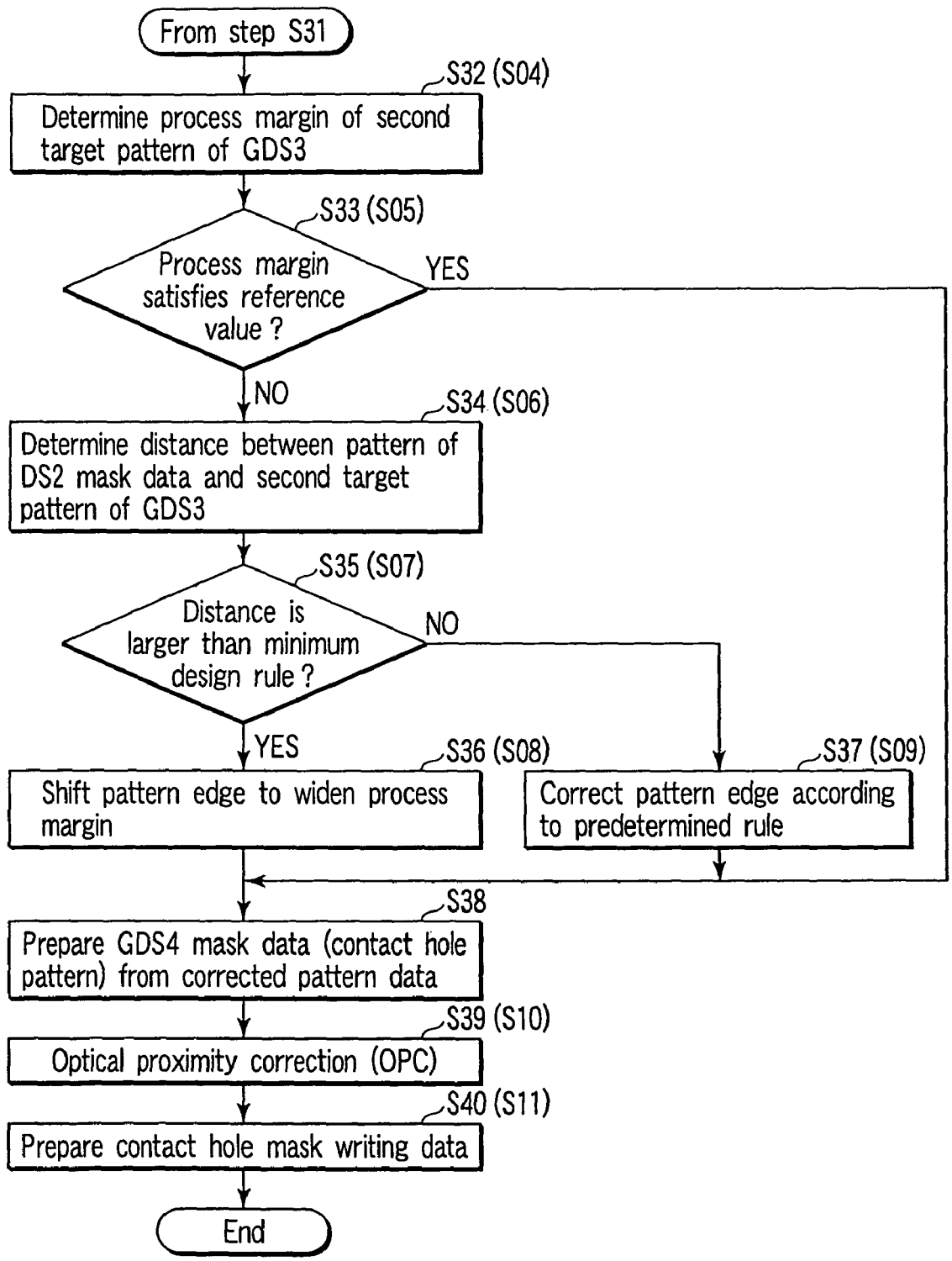
FIG. 12 is a flowchart following FIG. 11 to explain the pattern forming method according to the second embodiment of the present invention.

FIG. 11 and FIG. 12 are flowcharts to explain a pattern forming method according to a second embodiment of the present invention. The flowchart of FIG. 11 and FIG. 12 shows the processes until exposure mask writing data is prepared from design pattern data of semiconductor device. In the second embodiment, the same reference numerals are used to designate the constituent parts identical to the first embodiment, and the details are omitted. Only different parts will be explained.

The second embodiment differs from the first embodiment in the following point. If it is determined that circuit-patterns to be formed in the first and second exposure masks both have smaller process margin, correction is made with respect to both first and second target patterns.

As shown in FIG. 11, design pattern data (referred to as GDS1) to be formed in the first exposure mask is acquired from a design pattern data memory according to predetermined design rule (step S21). In addition, design pattern data (referred to as GDS3) to be formed in the second exposure mask is acquired from the design pattern data memory (step S22).

The same procedures described in steps S04 to S09 of the flowchart shown in FIG. 1 are carried out. More specifically, a circuit pattern is extracted from the GDS1, the process margin is found, and pattern edge is shifted so that the process margin is take larger than the reference value (steps S23 to S28).

Based on the corrected result, new exposure mask data (referred to as GDS2) of the GDS1 is prepared (step S29).

Then, the same procedures described in steps S10 and S11 of the flowchart shown in FIG. 1 are taken. More specifically, OPC pattern is given to necessary portion of the corrected circuit pattern, and optical proximity correction is carried out to obtain exposure mask writing data of the GDS1 (steps S30 and S31).

As depicted in FIG. 12, a pattern corresponding to the GDS1 in step S23 is extracted from the GDS3 in the same manner as steps S04 to S09 of the flowchart shown in FIG. 1, and thereafter, the process margin is found. Pattern edge is shifted so that the process margin is taken larger than the reference value (steps S32 to S37).

The different from the first embodiment is to find the distance between GDS2 and DGS3 patterns using the DGS2 prepared in step S29 (step S34).

Based on the corrected result, new exposure mask data (referred to as GDS4) of the GDS3 is prepared (step S38).

Finally, an OPC pattern is given to necessary portions of the corrected circuit pattern in the same manner as steps S10 and S11 of the flowchart shown in FIG. 1. Optical proximity correction is carried out to obtain exposure mask data of the GDS3 (steps S39 and S40).

The foregoing pattern forming processes are repeatedly carried out with respect to all circuit patterns existing in design pattern data GDS1 and GDS3, and exposure mask writing data is finally given.

The following is a detailed explanation of the case of correcting circuit pattern by the pattern forming method to improve process margin.

Figure 13:
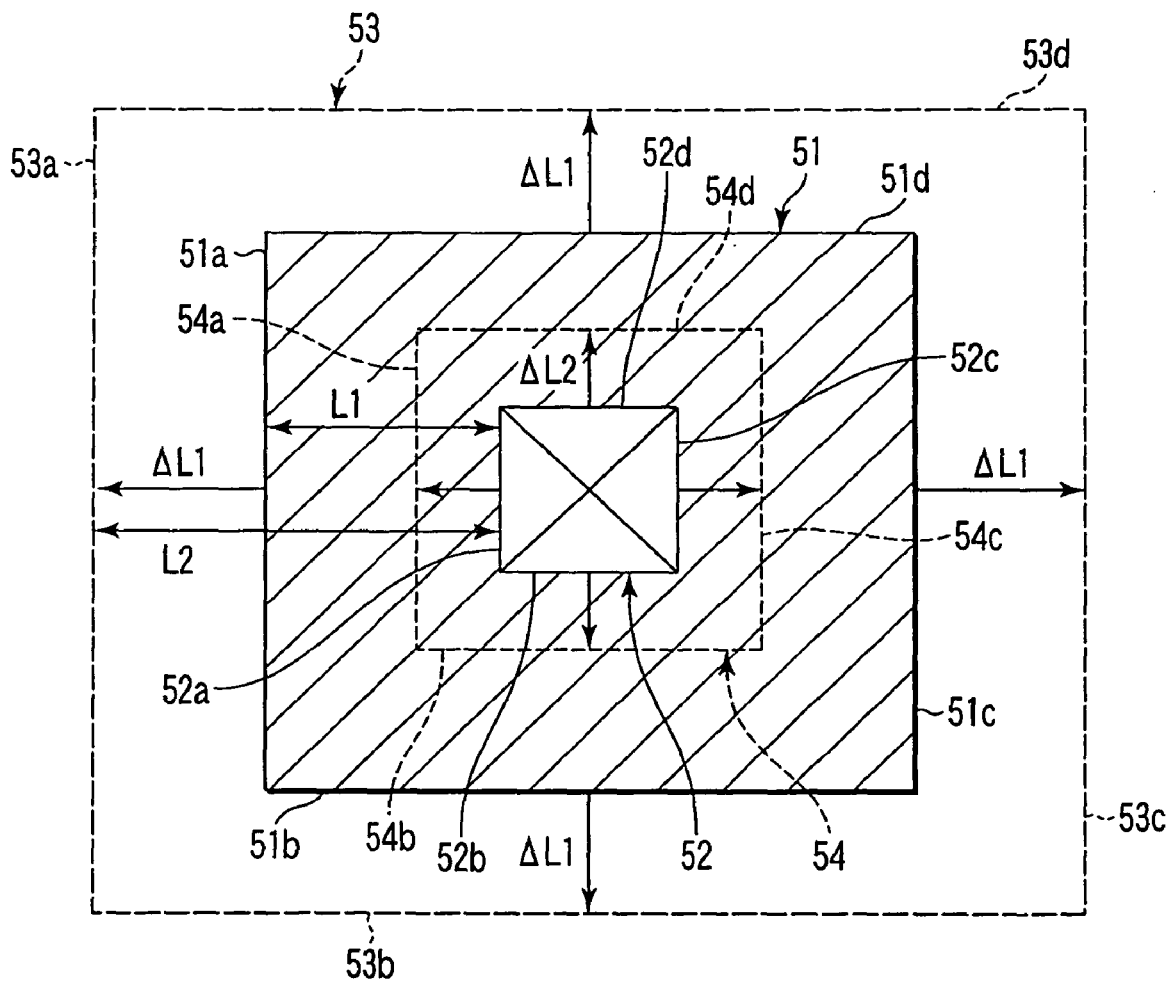
FIG. 13 is a view showing a circuit pattern for explaining the pattern forming method according to the second embodiment of the present invention.

FIG. 13 is a view showing a pattern obtained by overlapping two exposure masks, in which a metal electrode pattern and a contact hole pattern are arranged in a state of being coaxially overlapped in similar figures.

As seen from FIG. 13, a metal electrode pattern 51 is arranged as GDS1 in the first exposure mask 11, and a contact hole pattern 52 is arranged as GDS3 in the second exposure mask 13.

As shown in FIG. 13, the semiconductor substrate is formed with a metal film, and thereafter, the metal electrode pattern 51 is formed by lithography technique, using the first exposure mask 11. Further, the semiconductor substrate is formed with metal film, and thereafter, the contact hole pattern 52 is opened in the metal film by lithography technique, using the second exposure mask 13.

Here, the distance between the edge 51a of the metal electrode pattern 51 and the edge 52a of the contact hole pattern 52 is set as L1.

If it is determined that the metal electrode pattern 51 of the first exposure mask 11 has process margin less than the reference value in the lithography process according to the flowchart shown in FIG. 11, the following procedure is carried out. Edges 51a to 51d of the metal electrode pattern 51 are shifted outside by ΔL1. By doing so, the dimension of the metal electrode pattern 51 is made large so that the process margin is taken larger than the reference value.

The procedure described above is carried out, and thereby, a corrected new metal electrode pattern (GDS2) 53 shown by an imaginary line is obtained. Based on the obtained pattern, first exposure mask writing data is prepared.

Likewise, if it is determined that the contact hole pattern 52 of the second exposure mask 13 has process margin less than the reference value in the lithography process according to the flowchart shown in FIG. 12, the following procedure is taken. The design pattern distance L1 between exposure masks is determined, and thereafter, based on the result, correction for forming a new pattern is made to widen the process margin.

For example, if the distance L1 between the edge 51a of the metal electrode pattern 51 and the edge 52a of the contact hole pattern 52 is equal to Lmin, it is impossible to shift the edge 52a. For this reason, the distance L2 between the edge 53a of the corrected new metal electrode pattern (GDS2) 53 and the edge 52a of the contact hole pattern 52 is measured. Edges 52a to 52d of the contact hole pattern 52 are shifted outside by ΔL2. By doing so, the dimension of the contact hole pattern 52 is made large so that the process margin is taken larger than the reference value.

The procedure described above is carried out, and thereby, a corrected new contact hole pattern (GDS4) 54 shown by an imaginary line is obtained. Based on the obtained pattern, first exposure mask writing data is prepared.

According to the pattern forming method of the second embodiment of the present invention, patterns coaxially overlapped with each other in similar figures when a plurality of exposure masks are used to provide a pattern, are extracted. Pattern correction is carried out in accordance with the distance between the patterns of the masks, and thereby, the process margin between the patterns of the masks is improved. Consequently, the transfer accuracy of the patterns of the masks to the semiconductor substrate is improved, so that semiconductor devices can be readily manufactured.

Third Embodiment

The pattern forming system according to a third embodiment of the present invention will be explained below with reference to FIG. 14. The pattern forming system according to the third embodiment is used for realizing the pattern forming method described in the first and second embodiments of the present invention.

FIG. 14 is a block diagram showing the configuration of the pattern forming system according to the third embodiment of the present invention.

As shown in FIG. 14, a pattern forming system 61 of the present embodiment comprises design-pattern data memory section 62, program storage section 63, mask writing data memory section 64, processing control section 65, output and input devices 67 and 68. More specifically, the design pattern data memory section 62 stores the layout design pattern data of the semiconductor device. The program storage section 63 stores programs for correcting exposure mask pattern to form a new pattern. The mask writing data memory section 64 stores obtained exposure mask writing data. The processing control section 65 includes means for carrying out a series of mask pattern correction processing. The output device 67 outputs processing results via an input-output control section 66, and the input device 68 inputs instructions to the processing control section 65.

The foregoing design pattern data memory section 62, program storage section 63 and mask writing data memory section 64 may be partially composed of main memory device built in a computer. In addition, these sections 62 to 64 may be composed of memory devices such as semiconductor memory, magnetic disk, magnetic tape and optical disk, which are connected to the computer.

The processing control section 65 constitutes part of the central processing unit of the computer system, and is operated by a centralized or distributed processing type computer system.

The processing control section 65 is composed of pattern extraction section 69, pattern determination section 70, pattern correction section 71, optical proximity correction section 72 and mask writing data preparing section 73. More specifically, the pattern extraction section 69 reads circuit patterns to be formed in first and second exposure masks from the design pattern data memory section 62. Thereafter, the pattern extraction section 69 extracts first and second target patterns from the circuit patterns to be formed in the first and second exposure masks. The pattern determination section 70 determines whether or not process margin satisfies a predetermined reference value with respect to variations of exposure parameters. The pattern correction section 71 corrects a pattern, which is determined as having no process margin satisfying the reference value so that the process margin is widened. The optical proximity correction section 72 gives OPC pattern to necessary portion of the corrected design pattern to carry out optical proximity correction (OPC). The mask writing data preparing section 73 prepares exposure mask writing data for forming the final pattern on the exposure mask. In this case, the final pattern has improved process margin larger than the reference value, and already receives the optical proximity correction.

The foregoing pattern extraction section 69, pattern determination section 70, pattern correction section 71, optical proximity correction section 72 and mask writing data preparing section 73 are previously stored in the program storage section 63 as software. These sections are operated by the central processing unit of the computer system according to the procedure. In this case, these sections may be operated by dedicated hardware.

In the pattern forming system according to the present third embodiment, pattern correction is made in accordance with the distance between the patterns positioned close to each other or overlapped with each other when a plurality of exposure masks having the patterns are used to provide a pattern. By doing so, it is possible to obtain exposure mask formed with the patterns having high process margin.

Fourth Embodiment

Figure 15:
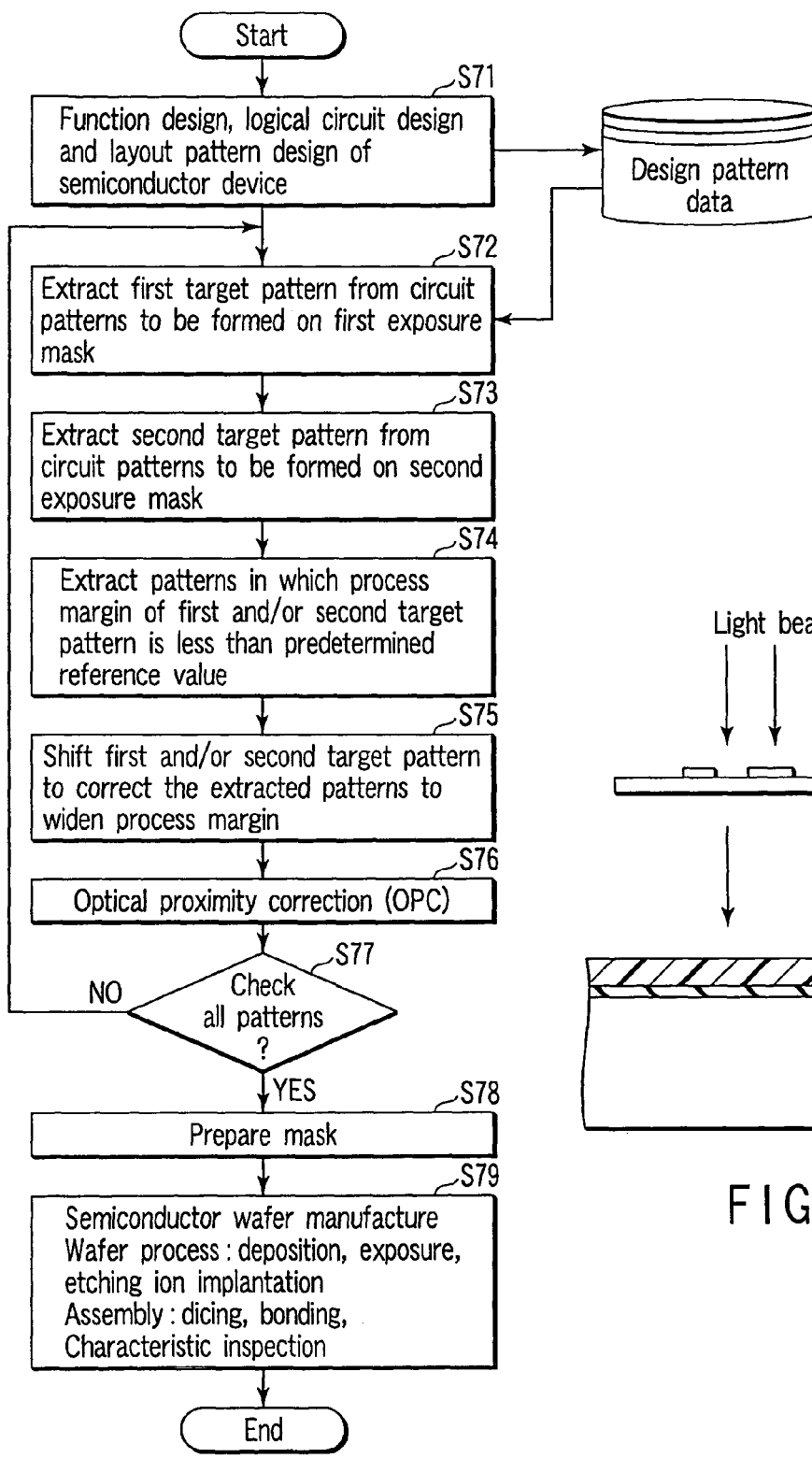
FIG. 15 is a flowchart to explain a process of a method of manufacturing a semiconductor device according to a fourth embodiment of the present invention.

The method of manufacturing a semiconductor device according to a fourth embodiment of the present invention will be explained with reference to FIG. 15. According to the method of manufacturing a semiconductor device according to the fourth embodiment, semiconductor devices are manufactured using the pattern forming system described in the third embodiment. FIG. 15 is a flowchart to explain the method of manufacturing a semiconductor device according to the fourth embodiment of the present invention.

Function design, logical circuit design and layout pattern design for semiconductor devices to be manufactured are made (step S71).

In other words, function design is made in a manner of clarifying functions necessary for realizing the objects and effects of semiconductor devices to be manufactured, and designing mutual linkage with various functions such as logic memory for performing the function and input-output interface.

Logical circuit design for designing electronic circuits is made based on various functions and relationship. Then, layout design is made to arrange various electronic circuits on a semiconductor chip. Thereafter, circuit patterns to be formed on several exposure masks used in a serial manufacture processes of semiconductor wafer is designed to satisfy the design rule.

The layout design pattern data is sent to the design pattern memory section, and thereafter, circuit patterns having process margin less than the reference value described in the first and second embodiments is extracted. The circuit patterns are corrected so that the process margin is taken larger than the reference value.

More specifically, a first target pattern is extracted from patterns to be formed on the first exposure mask (step S72). A second target pattern to be formed close to the first target pattern is extracted from patterns to be formed on the first exposure mask (step S73).

A pattern having process margin less than the predetermined reference value is extracted based on process variations of the first and second target patterns (step S74). Pattern correction is made in a manner of shifting each edge of the first or second target pattern to widen the process margin (step S75).

Then, optical proximity correction (OPC) pattern is added to necessary portion of the corrected design pattern to carry out optical proximity correction (step S76).

Exposure mask writing data for forming the final pattern having improved process margin and receiving optical proximity correction on exposure mask is prepared. Based on the prepared exposure mask writing data, exposure mask is manufactured (step S78).

Figure 16:
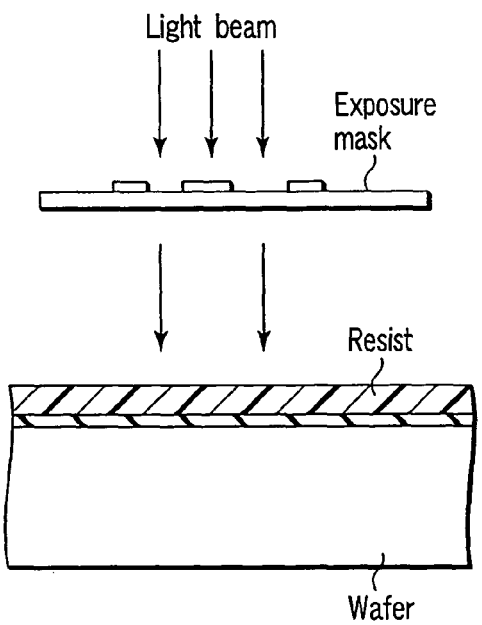
FIG. 16 is a cross sectional view for explaining the manufacturing method according to the fourth embodiment of the present invention.
Figure 17:
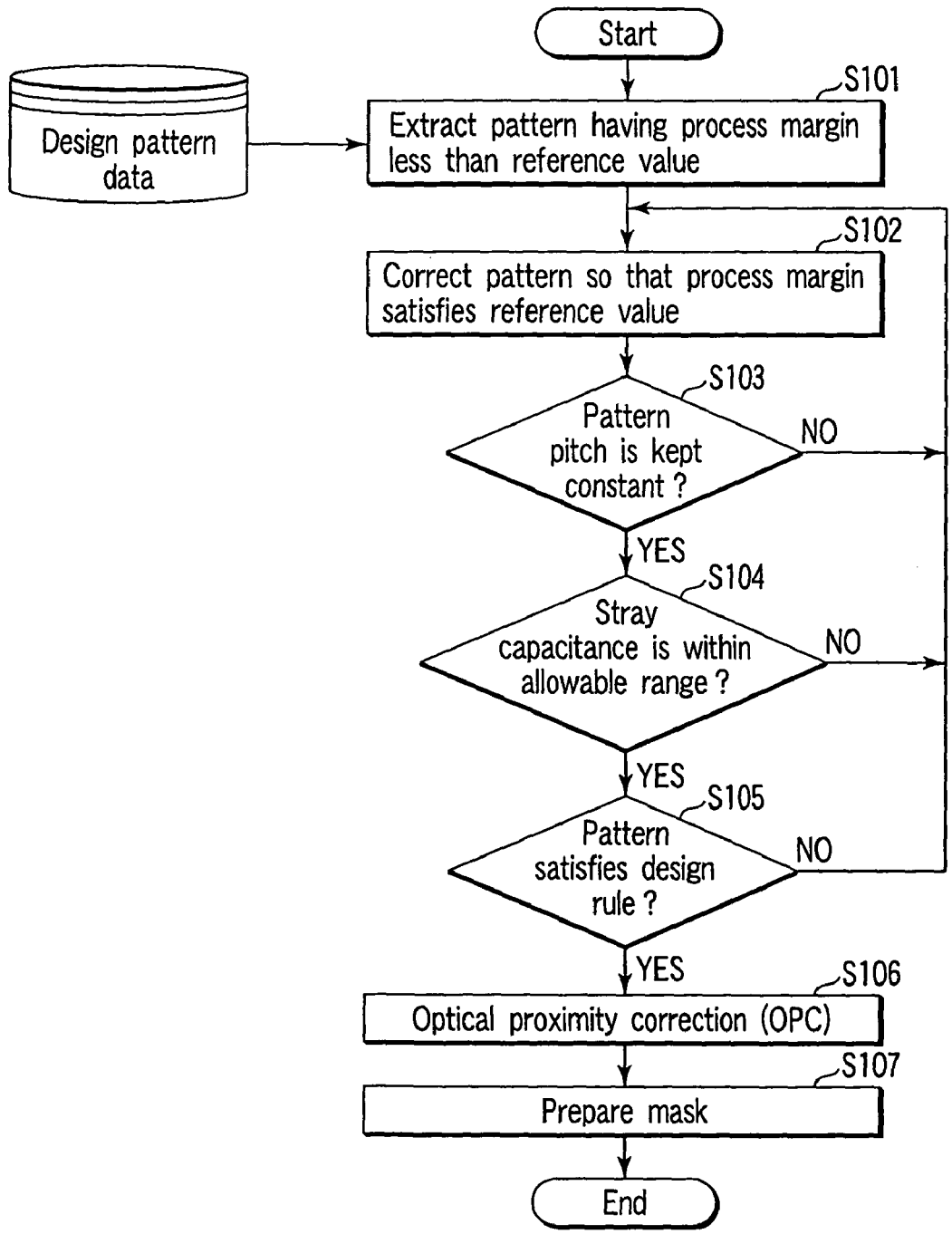
FIG. 17 is a flowchart to schematically explain a conventional pattern forming method.
Figure 18:
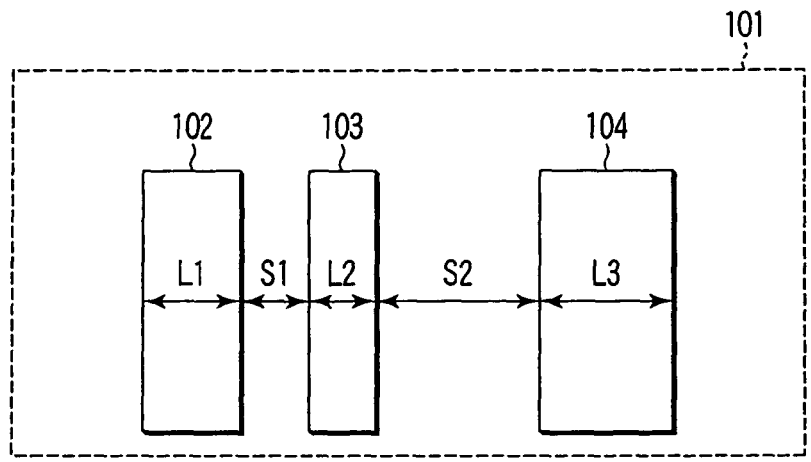
FIG. 18 is a view showing the layout before circuit patterns are corrected.
Figure 19:
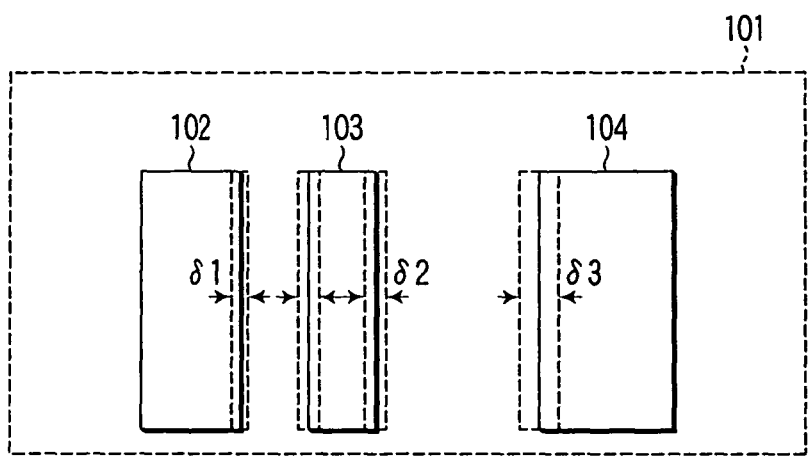
FIG. 19 is a layout view showing circuit the patterns of maximum and minimum line dimension when conditions such as an exposure amount and a focal length are varied to the circuit patterns shown in FIG. 18.
Figure 20:
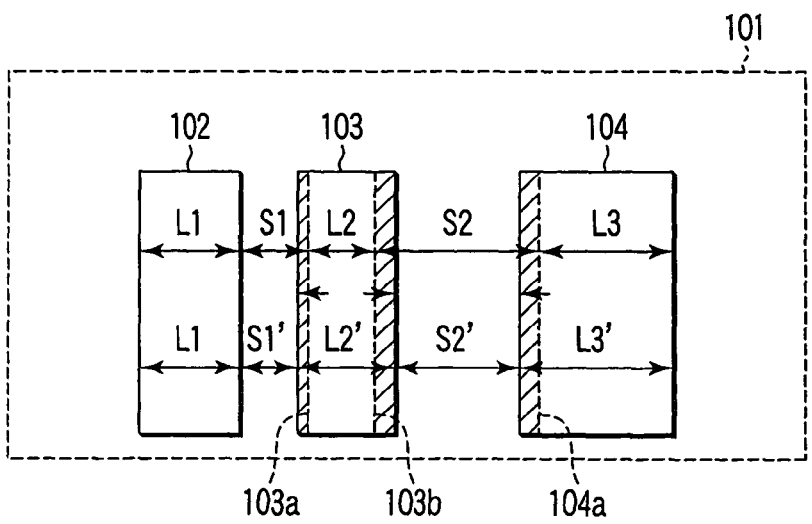
FIG. 20 a view showing the layout after the circuit patterns shown in FIG. 18 are corrected.

Semiconductor devices are collectively formed on the semiconductor wafer via the following processes (wafer process) (step S79). One of the processes is a deposition process of depositing insulating film, semiconductor film and metal films onto the semiconductor substrate. Another is a lithography process to the semiconductor substrate using the foregoing exposure mask, as shown in FIG. 16. Another is an etching process and a series of wafer manufacture processes repeating ion implantation. Thereafter, the semiconductor devices are manufactured via dicing, bonding and inspection processes (assembly and testing process).

According to the method of manufacturing the semiconductor device of the present fourth embodiment, patterns are transferred to the semiconductor substrate using a plurality of exposure masks having a high process margin between the patterns. Therefore, semiconductor devices can be manufactured with high yield.

As is evident from the foregoing description, according to the embodiments of the present invention, process margin between patterns positioned close to each other or overlapped with each other when a plurality of exposure masks having the patterns are used to provide a pattern, is improved.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A pattern forming system of forming a desired pattern on a semiconductor substrate comprising:
    an extracting section configured to extract a first pattern of a first layer;
    an extracting section configured to extract a second pattern of one or more second layers different from the first layer;
    a calculating section configured to calculate a distance between the first and second patterns on a semiconductor substrate based on a predetermined process variation;
    a determining section configured to determine whether or not the distance between the first and second patterns satisfies an allowable margin provided for the distance between the first and second patterns; and
    a correcting section configured to correct, if the distance does not satisfy the allowable margin, at least one of the first and second patterns to satisfy the allowable margin.

2. The pattern forming system according to claim 1, wherein the first and second patterns comprise one of a design pattern and a mask pattern formed on a mask.

3. The pattern forming system according to claim 1, wherein the process variation includes at least one of a variation of an exposure quantity of an exposure apparatus, a variation of a focal distance, a variation of an exposure irradiation, a variation of a lens aberration, a variation of a mask dimension, a variation of a development process, and a variation of an etching process.

4. The pattern forming system according to claim 1, wherein the first and second patterns satisfy a predetermined design rule.

5. The pattern forming system according to claim 4, wherein the predetermined design rule is defined by lithography simulation or experiment.

6. The pattern forming system according to claim 1, wherein, if the first and second patterns are first and second design patterns, correcting at least one of the first and second patterns to satisfy the allowable margin comprises correcting the first and second design patterns to satisfy a predetermined design rule.

7. The pattern forming system according to claim 1, wherein correcting at least one of the first and second patterns to satisfy the allowable margin comprises widening dimensions of the first and second patterns.

8. The pattern forming system according to claim 1, wherein a minimum distance between the first and second patterns after correcting at least one of the first and second patterns satisfies a predetermined minimum width.

9. The pattern forming system according to claim 1, further comprising, after correcting at least one of the first and second patterns, carrying out the extracting a first pattern, the extracting a second pattern, the determining, and the correcting for another first pattern and another second pattern.

10. A mask pattern forming system of forming a desired pattern on a semiconductor substrate comprising:
    an extracting section configured to extract a first design pattern of a first layer;
    an extracting section configured to extract a second design pattern of one or more second layers different from the first layer;
    a correcting section configured to correct the first design pattern in accordance with a correction rule of a design pattern that is defined by at least one of (i) widths of the first and second design patterns and (ii) a distance between the first and second design patterns; and
    a forming section configured to form a mask pattern by further correcting, by process proximity effect correction, the first design pattern that has been corrected in accordance with the correction rule.

11. The mask pattern forming system according to claim 10, further comprising:
    an extracting section configured, after the extracting section configured to extract a first design pattern extracts the first design pattern, to extract a third design pattern of the first layer; and
    a correcting section configured to correct the first design pattern in accordance with a correction rule of a design pattern that is defined by (i) at least one of widths of the first and third design patterns and (ii) a distance between the first and third design patterns.

12. The mask pattern forming system according to claim 10, wherein the process proximity effect correction includes at least one of correction for a variation of an etching process, correction for a variation of a lithography process, and correction for a variation of a mask process.

* * * * *